United States Patent [19]

Taylor

[11] Patent Number: 5,789,323
[45] Date of Patent: Aug. 4, 1998

[54] FABRICATION OF METAL-FERROELECTRIC-METAL CAPACITORS WITH A TWO STEP PATTERNING SEQUENCE

[75] Inventor: Thomas C. Taylor, Colorado Springs, Colo.

[73] Assignee: Ramtron International Corporation, Colorado Springs, Colo.

[21] Appl. No.: 428,544

[22] Filed: Apr. 25, 1995

[51] Int. Cl.$^6$ ............................................. H01L 21/302
[52] U.S. Cl. ............................................. 438/706; 216/6
[58] Field of Search ............................ 438/384, 694, 438/706, 734; 430/314; 216/6, 72

[56] References Cited

U.S. PATENT DOCUMENTS

| | | | |
|---|---|---|---|
| 5,439,840 | 8/1995 | Jones et al. | 437/52 |
| 5,618,749 | 4/1997 | Takahashi et al. | 438/384 |

*Primary Examiner*—John Goodrow
*Attorney, Agent, or Firm*—Peter J. Meza, Esq.; Carol W. Burton, Esq.

[57] ABSTRACT

A method of fabricating a metal-ferroelectric-metal ("MFM") capacitor includes the steps of depositing a silicon dioxide layer on a silicon or other substrate, a lower platinum or other noble metal electrode, a PZT or other ferroelectric material dielectric layer, and an upper platinum or other noble metal electrode. The upper electrode and ferroelectric dielectric layer are patterned and etched according to a first pattern corresponding to the final dimensions of the ferroelectric dielectric layer. The upper electrode and lower electrode are subsequently patterned and etched according to a second pattern corresponding to the final dimensions of one or more upper electrodes and the final extent of the lower electrode. The second etching step leaves a benign vestigial upper electrode feature. An oxide layer is finally deposited over the entire surface of the MFM capacitor structure, which is etched and metalized over desired upper and lower electrode contacts.

10 Claims, 7 Drawing Sheets

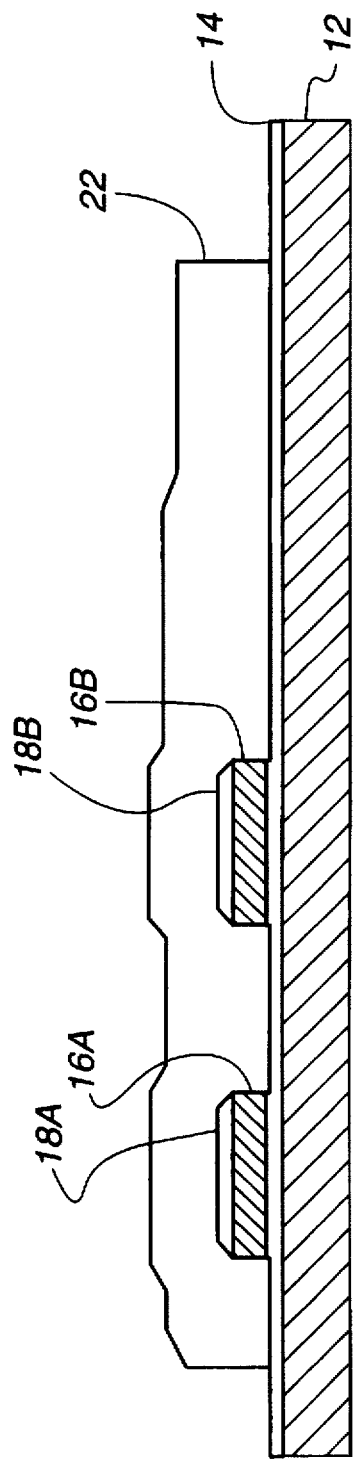
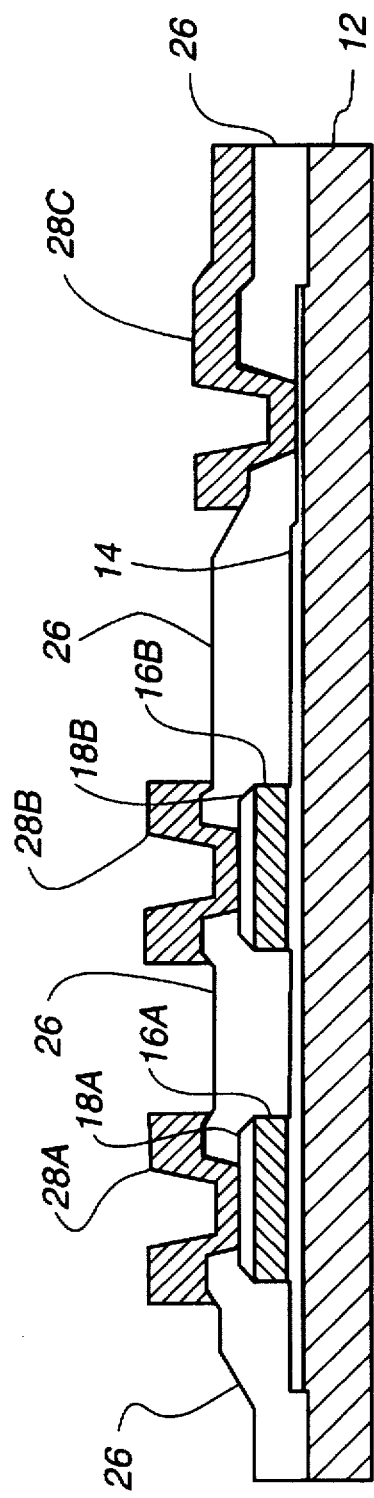
Fig. 3C
Prior Art
Fig. 3D
Prior Art

1

FABRICATION OF METAL-FERROELECTRIC-METAL CAPACITORS WITH A TWO STEP PATTERNING SEQUENCE

BACKGROUND OF THE INVENTION

This invention relates generally to metal-ferroelectric-metal ("MFM") capacitors, and, more particularly, to a fabrication method thereof involving two masking steps.

MFM capacitors allowing independent contacts between an interconnect level and the upper and lower capacitors electrodes are typically fabricated in a three-step patterning sequence. The upper electrode of the capacitor is masked and etched in one operation, the ferroelectric dielectric in a second, and the lower electrode in a third. Previous attempts to simplify the process by simultaneously patterning upper electrodes and ferroelectric dielectrics have the property of leaving the electrode and dielectric feature edges coincident, which introduces the possibility of degraded capacitor performance and/or a high risk of upper-to-lower electrode shorts due to processing-induced deposition of conductive residues on the dielectric sidewalls.

Avoidance of the above-mentioned problems has forced acceptance of a capacitor layout in which the edges of the upper electrodes are offset inside the edges of the patterned capacitor dielectric; this is accomplished through separate, sequential patterning operations.

In the conventional scheme, the electrodes and capacitor dielectric are delineated by transferring a lithographically defined photoresist pattern by etching or milling processes. A defect in the standard process is related to the high rate of resist pattern attack during ferroelectric dielectric etch; the fidelity of the feature ultimately transferred to the ferroelectric material is consequently poor. Electrode patterning typically does not suffer this defect primarily because of the short duration of exposure to the etch environment allowed by the relatively thin films employed (less than 200 nanometers).

A prior art three-reticle MFM capacitor fabrication sequence 10 is shown in FIGS. 1A–E, for the fabrication of a ferroelectric capacitor structure illustratively having two upper electrodes (although any number can be used), a lower electrode, and associated metal interconnect. The sequence starts in FIG. 1A with a layer 12 of silicon dioxide ($SiO_2$) about 5000 Angstroms thick on a silicon or other substrate (not shown in FIG. 1A). A lower electrode 14 consists of a layer of platinum (Pt) about 1750 Angstroms thick, and an adhesion layer of titanium (Ti) about 200 Angstroms thick that interfaces to silicon dioxide layer 12. A lead zirconate titanate (PZT) ferroelectric dielectric layer 16 is deposited on lower electrode 14 to a thickness of about 3000 Angstroms. An upper electrode 16 consists of a layer of platinum about 1750 Angstroms thick. A photoresist layer 20 is defined by a first reticle and patterned to form photoresist features 20A and 20B. In FIG. 1B, the upper electrode 18 has been etched to form upper electrodes 18A and 18B, and dielectric layer 16 has been thinned due to the overetching of the upper electrodes 18A and 18B. A photoresist layer 22 is defined by a second reticle and patterned. Photoresist layer 22 is then used to define dielectric layer 16. In FIG. 1C, dielectric layer 16 and photoresist layer 22 have been etched. A thinned portion of photoresist layer 22 remains after the etch. Note in FIG. 1C that photoresist erosion during etching of dielectric layer 16 has caused linewidth loss 23 from the original boundaries of photoresist layer 22. In FIG. 1D, a photoresist layer 24 is defined with a third reticle for the

2 definition of lower electrode 14. Thinning of lower electrode 14 from overetching of dielectric layer 16 can also be seen in FIG. 1D. The finished capacitor structure can be seen in FIG. 1E, including an oxide dielectric layer 26 about 3000 Angstroms thick in which contacts have been opened to upper electrodes 18A and 18B, as well as lower electrode 14. The contacts have been metalized with a metal layer 28, which has been etched to form separate interconnects 28A to upper electrode 18A, 28B to upper electrode 18B, and 28C to lower electrode 14. Metal layer 28 can be formed of any number of materials including aluminum and gold. If aluminum is used, a lower portion of metal layer 28 is titanium nitride (TiN) about 500 to 1000 Angstroms thick, which is used as a barrier layer to prevent undesirable direct contact between platinum and aluminum.

The equivalent circuit of the MFM capacitor structure of FIGS. 1A–E is shown in FIG. 2. A first ferroelectric capacitor 29A has terminals 28A and 28C corresponding to the metal interconnect shown in FIG. 1E. A second ferroelectric capacitor 29B has terminals 28B and shared terminal 28C also corresponding to the metal interconnect shown in FIG. 1E.

A prior art two-reticle MFM capacitor fabrication sequence 30 is shown in FIGS. 3A–D, for the fabrication of a ferroelectric capacitor also having two upper electrodes, a lower electrode, and associated metal interconnect. The sequence starts in FIG. 3A with the same layers 12, 14, 16, and 18, as well as patterned photoresist features 20A and 20B shown in FIG. 1A. In FIG. 3B, dielectric layer 16 and upper electrode 18 have been etched to form two separate dielectric regions 16A and 16B, as well as two upper electrodes 18A and 18B. Two resist layer areas 20A and 20B remain after dielectric layer 16 and upper electrode 18 have been etched. Severe resist erosion during etching of dielectric layer 16 causes a taper in upper electrode 18. Lower electrode 14 has been thinned due to the overetching of dielectric layer 16 and upper electrode 18. The sidewalls of dielectric regions 16A and 16B and subject to the undesirable redeposition of conductive etch residues from lower electrode 14 during overetching. This can cause upper-to-lower electrode shorts, destroying the functionality of the capacitor structure. Referring now to FIG. 3C, a photoresist layer 22 is defined by a second reticle and patterned. Photoresist layer 22 is then used to define lower electrode 14. The finished capacitor structure can be seen in FIG. 3D, including etched oxide dielectric layer 26, as well as separate interconnects 28A, 28B, and 28C.

What is desired is a two-reticle MFM capacitor fabrication method that does not have the upper-to-lower electrode shorting problems and other problems associated with the prior art techniques described above.

SUMMARY OF THE INVENTION

It is, therefore, a principal object of the present invention to fabricate an MFM capacitor using two reticles, while avoiding the upper-to-lower electrode shorting problems found in the prior art two reticle fabrication method.

It is another object of the invention to simplify the fabrication process and reduce the cost of production due to elimination of a resist masking and corresponding etching operation.

It is an advantage of the invention that the benefits inherent in layouts that offset the edges of the upper electric and ferroelectric dielectric sidewalls are retained.

It is another advantage of the invention that superior pattern transfer fidelity during etching of the ferroelectric dielectric layer is provided, as compared to the prior art three-step resist masking processes.

It is a feature of the present invention that upper electrodes of uniform thickness across the entire capacitor area are provided.

According to the present invention, a method of fabricating an MFM capacitor that avoids the shorting and other problems of the prior art begins with a full ferroelectric capacitor stack deposited on a substrate including a lower electrode, a ferroelectric dielectric layer, and an upper electrode. A first reticle is used to define the ferroelectric dielectric features, etch the pattern into both the upper electrode and, with a change in etch chemistry, the underlying ferroelectric dielectric layer. Etching of the underlying ferroelectric layer may benefit from changes in reactants, reactor pressure, or applied radio-frequency ("RF") power (either frequency, power, details of the power distribution in the reactor, or combinations of the foregoing) as compared to the process conditions which produce optimum results for etching the upper electrode material. Although resist pattern fidelity is damaged during etch of the ferroelectric dielectric layer, the presence of the patterned upper electrode acts as a "hard mask", which ensures that the final features etched into the ferroelectric dielectric layer faithfully replicate those on the reticle. When the etching step is completed, remaining resist residue is stripped. A second reticle is used to define the final upper electrode pattern and, simultaneously, an extension of the lower electrode overlapping the ferroelectric dielectric layer and projecting a further distance to allow later contact between the lower electrode and an interconnect level. The overlap is present to avoid the possibility of lower electrode discontinuity due to misalignment of the resist pattern with respect to the initial resist pattern defined by the first reticle. The overlap leaves a vestigial portion of the upper electrode at the farthest extent of the ferroelectric dielectric layer that is benign from a device performance standpoint.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 3A–D are cross-sectional drawings illustrating a prior art two-reticle MFM capacitor fabrication sequence.

DETAILED DESCRIPTION

Figure 1A:
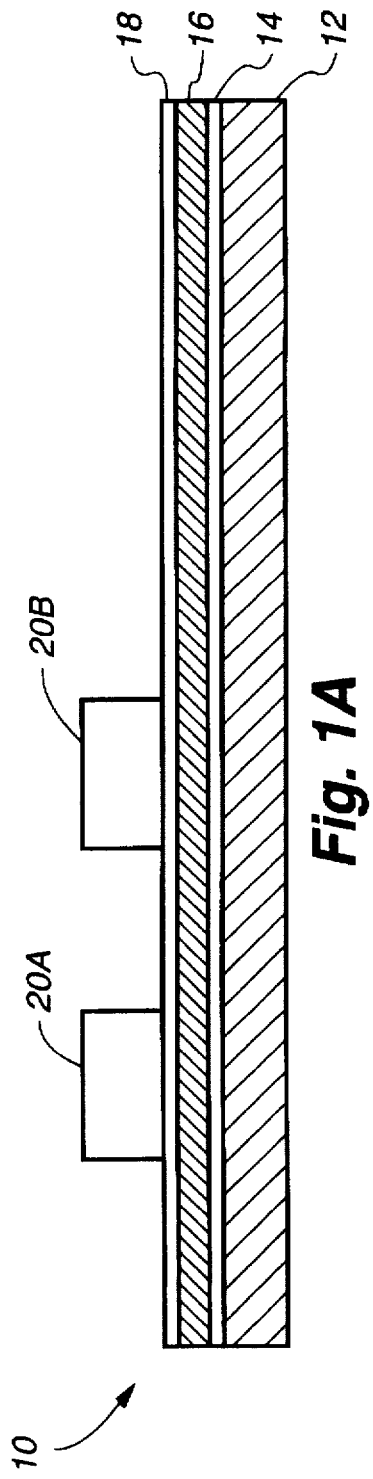
FIGS. 1A–E are cross-sectional drawings illustrating a prior art three-reticle MFM capacitor fabrication sequence.
Figure 1B:
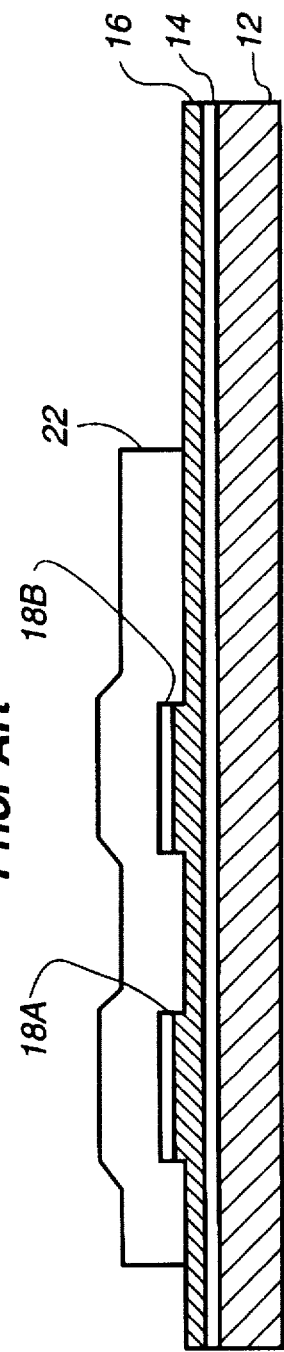
Figure 1C:
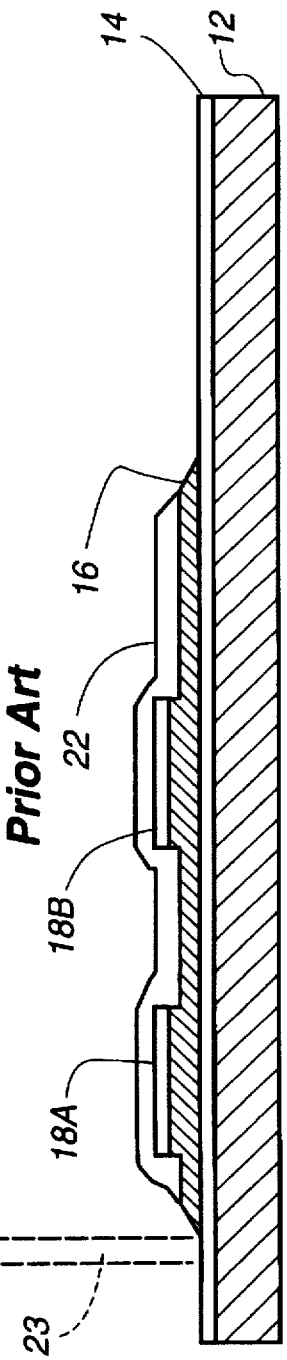
Figure 1D:
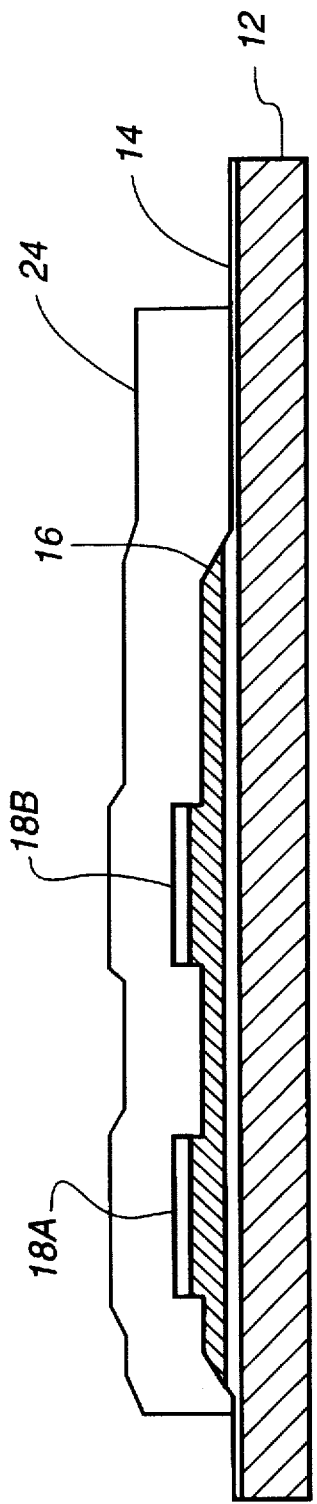
Figure 1E:
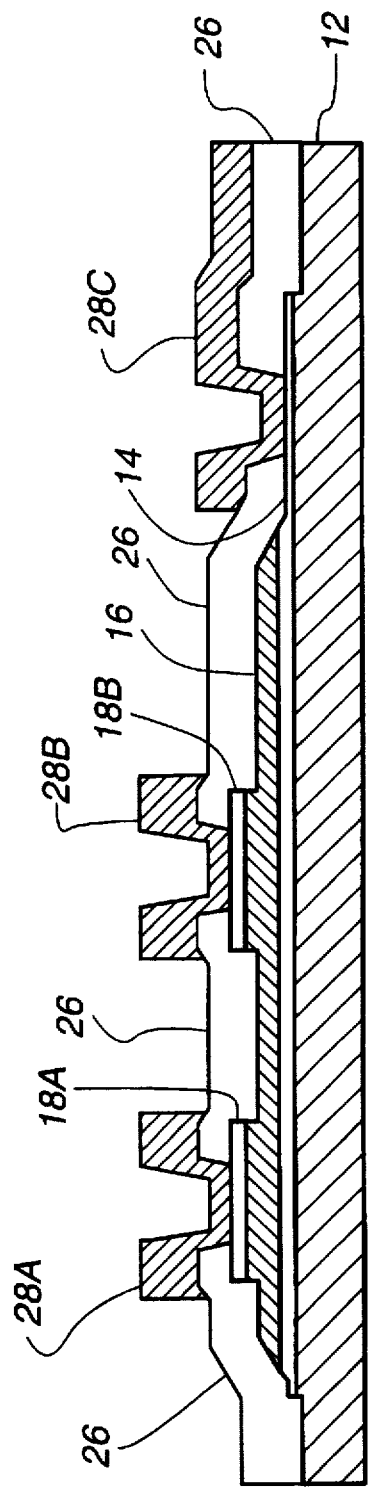
Figure 2:
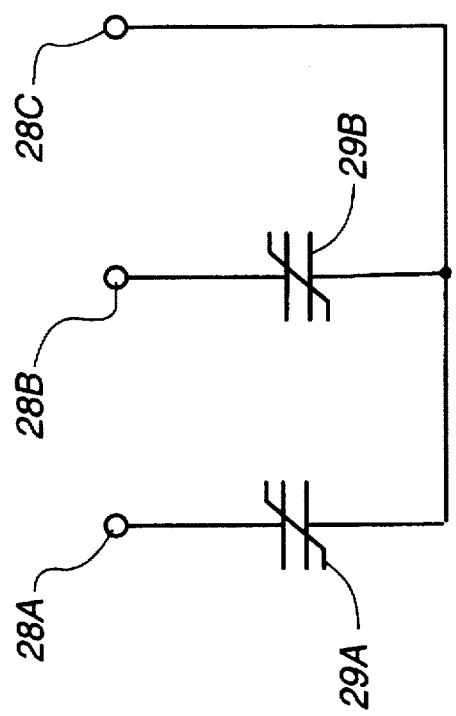
FIG. 2 is an equivalent circuit diagram of the capacitor structure fabricated in FIGS. 1A–E, FIGS. 3A–D, and FIGS. 4A–E.
Figure 3A:
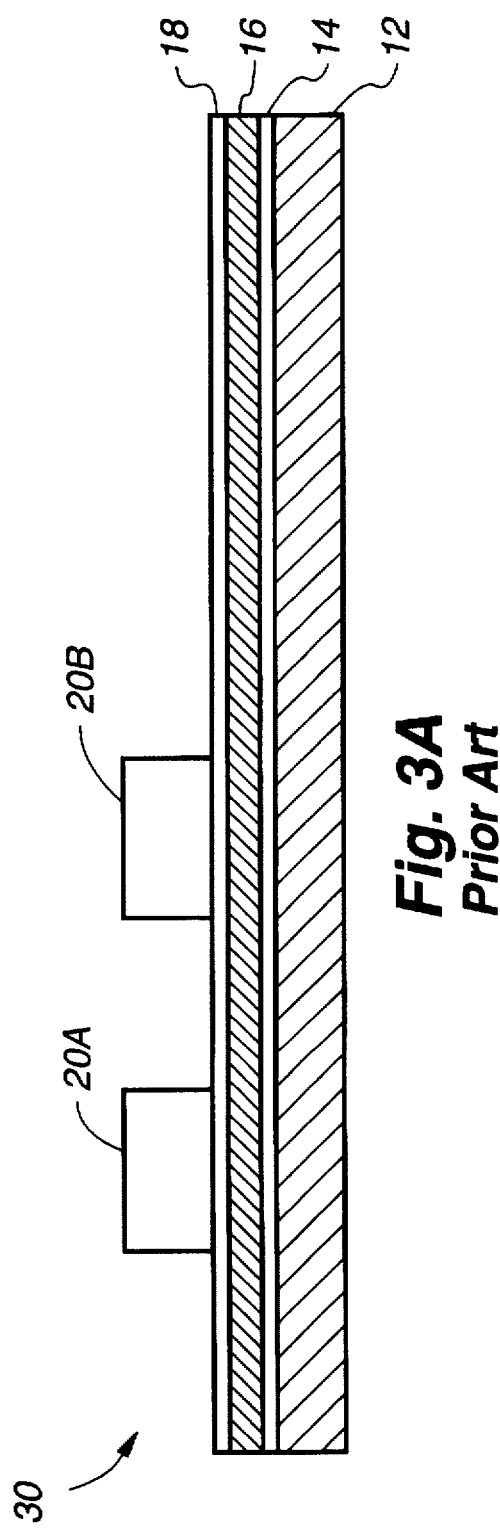
Figure 3B:
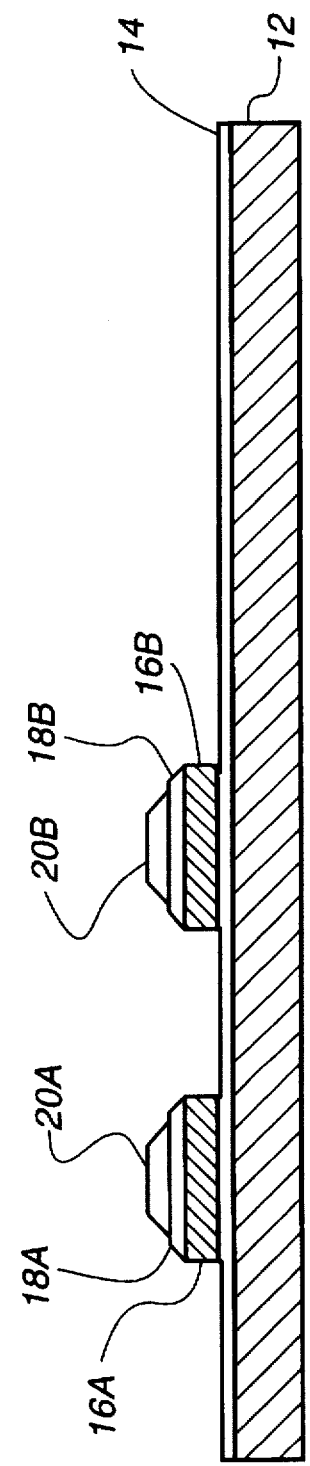
Figure 4A:
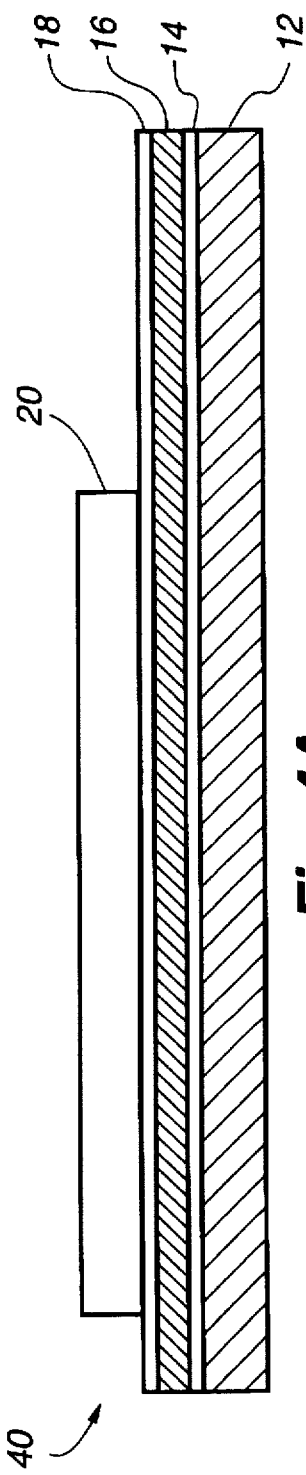
FIGS. 4A–E are cross-sectional drawings illustrating a two-reticle MFM capacitor fabrication sequence according to the present invention.
Figure 4B:
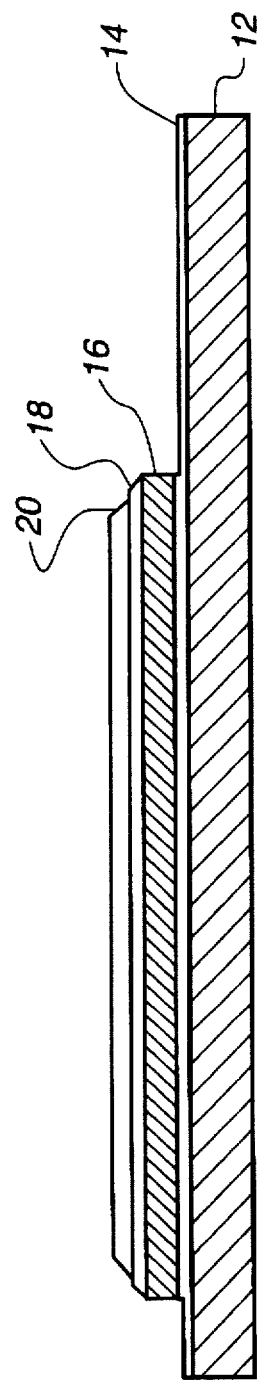
Figure 4C:
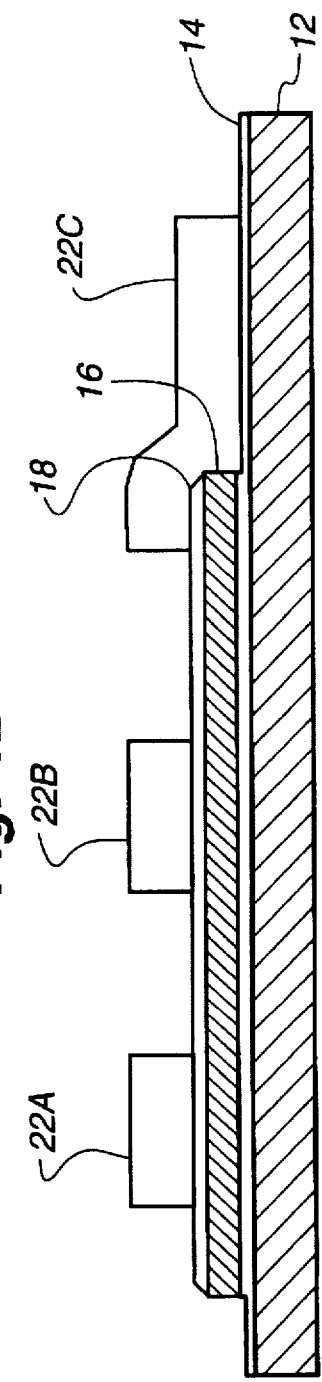
Figure 4D:
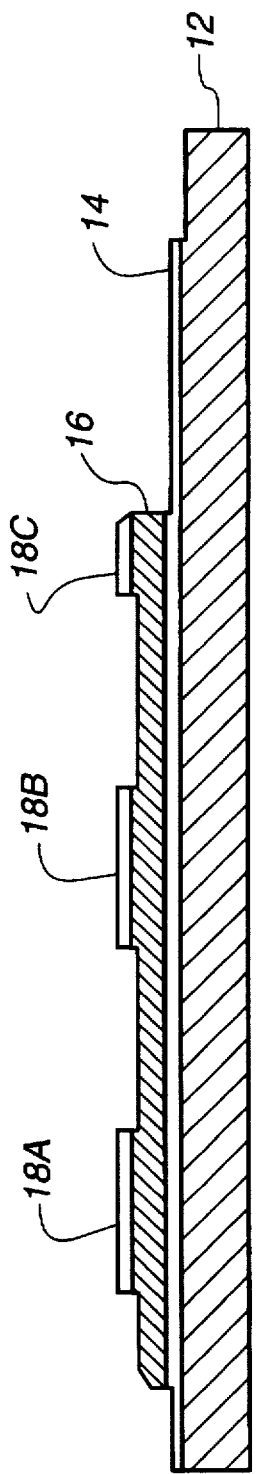
Figure 4E:
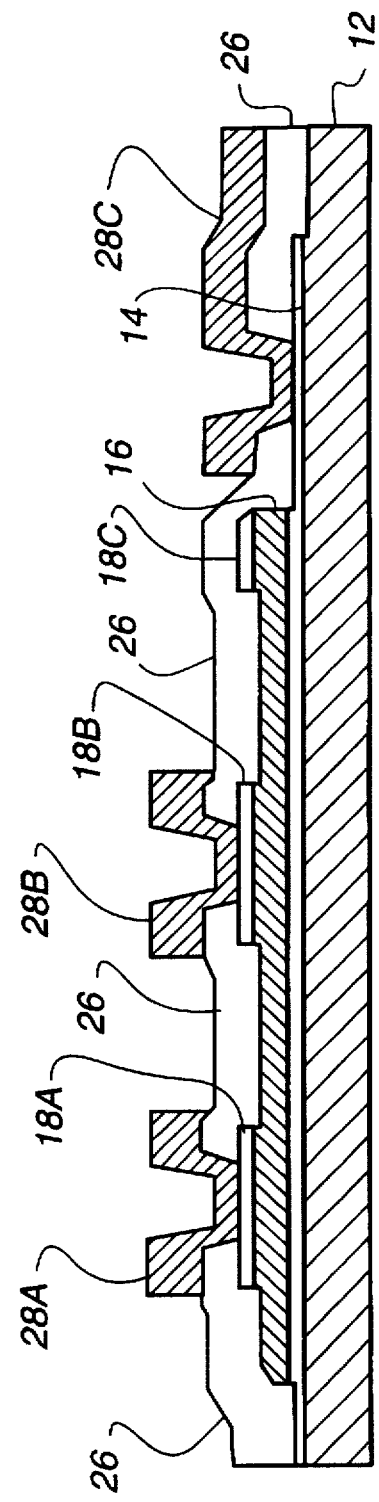

Referring now to FIGS. 4A–4E, a two-reticle MFM capacitor fabrication sequence 40 is shown according to the present invention, for the fabrication of a ferroelectric capacitor also having two upper electrodes, a lower electrode, and associated metal interconnect. The sequence starts in FIG. 4A with the same substrate layer 12, lower electrode 14, ferroelectric dielectric layer 16, and upper electrode layer 18 as shown in FIG. 1A. Also shown in FIG. 4A is a photoresist layer 20, defined by a first reticle, which, in turn, defines the extent of ferroelectric dielectric layer 16. In FIG. 4B, dielectric layer 16 and upper electrode 18 have been etched. Note that there is little or no ferroelectric dielectric layer 16 linewidth loss due to the use of upper electrode 18 as a "hard mask". A thinned layer of resist 20 remains after upper electrode 18 and ferroelectric dielectric layer 16 have been etched. Severe resist erosion causes an edge taper in upper electrode 18 and resist layer 20. Lower electrode 14 has been thinned due to the overetching of dielectric layer 16 and upper electrode 18. In FIG. 4C, a photoresist layer 22 is defined by a second reticle and patterned into photoresist areas 22A, 22B, and 22C that will ultimately define the upper and lower electrodes of the capacitor structure. In particular, photoresist area 22C is an "overlap" of ferroelectric dielectric layer 16 that defines one edge of an upper electrode, the extent of lower electrode 14, and provides alignment tolerance. In FIG. 4D, upper electrode 18 and lower electrode 14 have been patterned. Upper electrode 18 now consists of two separate upper electrodes 18A and 18B, as well as a benign vestigial upper electrode 18C cause by the overlap of photoresist area 22C. The extent of of lower electrode 14 is also established. Note that the taper of upper electrode 18 is translated into the underlying dielectric layer 16. Any undesirable conductive redeposition products on the sidewall of dielectric layer 16 are removed during the etch step. The finished capacitor structure can be seen in FIG. 4E, including etched oxide dielectric layer 26, as well as separate interconnects 28A (to upper electrode 18A), 28B (to upper electrode 18B), and 28C (to lower electrode 14). Note that vestigial upper electrode feature 18C is completely electrically isolated by oxide dielectric layer 26.

The details of etching the upper electrode 18 and the ferroelectric layer 16 in the preferred embodiment are given below. It should be noted, however, that wide ranges of reactor pressure, frequency, and power, may be used, and the selection of reactant gases varied, depending upon the application.

The upper electrode 16 is desirably etched for the preferred embodiment under the following conditions:

Reactor Pressure: 4 mTorr

Reactant Gases: Argon, Chlorine ($Cl_2$), and Oxygen ($O_2$)

RF Frequency: 13.56 MHz

RF Power: 750 Watts

When upper electrode 16 is completely etched, the reactor conditions are changed, without removal of the wafer in process from the reactor, to effect the etching of the ferroelectric dielectric layer 18, using the just-defined upper electrode pattern as a mask. The PZT ferroelectric layer 18 of the preferred embodiment is desirably etched under the following conditions:

Reactor Pressure: 7 mTorr

Reactant Gases: Argon, Carbon Tetrafluoride ($CF_4$)

RF Frequency: 13.56 MHz and 100 KHz

RF Power (13.56 MHz) 700 Watts

RF Power (100 KHz) 50 Watts

Having described and illustrated the principles of the invention in a preferred embodiment thereof, it is appreciated by those having skill in the art that the invention can be modified in arrangement and detail without departing from such principles. For example, the thicknesses and composition of the electrode materials and ferroelectric dielectric films may vary from those specified herein without substantially altering the invention. Furthermore, additional upper electrode layers may be used and patterned if desired to augment the function of the upper electrode as a "hard mask". The additional upper electrode layers would serve the primary purpose of augmenting the existing upper electrode's role as a pattern-transfer medium during plasma etching of the ferroelectric layer. I therefore claim all modifications and variations coming within the spirit and scope of the following claims.

I claim:

1. A method of fabricating an MFM capacitor comprising the steps of:

depositing on a substrate a lower electrode layer, a ferroelectric dielectric layer, and an upper electrode layer;

etching the upper electrode layer and ferroelectric dielectric layer according to a first pattern, exposing an upper surface of the lower electrode layer; and etching the upper electrode layer and the lower electrode layer without etching through the ferroelectric dielectric layer according to a second pattern, such that a portion of the exposed lower electrode remains.

2. The method of claim 1 in which the first etching step comprises the steps of:

applying a photoresist layer on an upper surface of the upper electrode layer;

defining a pattern in the photoresist layer corresponding to the dimensions of the MFM capacitor ferroelectric dielectric; and etching the upper electrode layer and the ferroelectric dielectric layer.

3. The method of claim 1 in which the second etching step comprises the steps of:

applying a photoresist layer on an upper surface of the upper electrode layer and an exposed portion of an upper surface of the lower electrode layer;

defining a pattern in the photoresist layer corresponding to the dimensions of one or more upper electrodes and the dimensions of the lower electrode; and etching the upper electrode layer and the lower electrode layer.

4. The method of claim 1 in which the second etching step further comprises the step of producing a vestigial upper electrode feature.

5. The method of claim 1 further comprising the step of depositing an oxide dielectric layer.

6. The method of claim 5 further comprising the step of etching the oxide dielectric layer to expose the surface of one or more upper electrodes and the surface of a lower electrode.

7. The method of claim 6 further comprising the step of individually metalizing the upper electrodes and lower electrode.

8. A method of fabricating an MFM capacitor comprising the steps of:

depositing an oxide layer on a substrate;

depositing a platinum lower electrode layer on the oxide layer;

depositing a PZT ferroelectric dielectric layer on the lower electrode layer;

depositing a platinum upper electrode layer on the ferroelectric dielectric layer;

etching the upper electrode layer and the ferroelectric layer according to a pattern determined by a first reticle, exposing an upper surface of the lower electrode layer;

etching the upper electrode layer and the lower electrode layer without etching through the ferroelectric dielectric layer according to a pattern determined by a second reticle, so that one or more upper electrodes, a vestigial upper electrode, and a bottom electrode having an exposed upper surface are formed.

9. The method of claim 8 further comprising the steps of:

depositing an oxide dielectric layer on the surface of the MFM capacitor; and etching the oxide dielectric layer to expose the surface of the upper electrodes and bottom electrode, wherein the vestigial upper electrode is electrically isolated.

10. The method of claim 9 further comprising the step of individually metalizing the upper electrodes and bottom electrode.

* * * * *